United States Patent
Chang et al.

(10) Patent No.: US 6,671,396 B1
(45) Date of Patent: Dec. 30, 2003

(54) METHOD TO MONITOR STEPPER LENS QUALITY IN COLOR FILTER PROCESS

(75) Inventors: Chih-Kung Chang, Hsin-Chu (TW); Bii-Jung Chang, Hsin-Chu (TW); Sheng-Liang Pang, Hsin-Chu (TW); Kuo-Liang Lu, Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 675 days.

(21) Appl. No.: 09/664,421

(22) Filed: Sep. 18, 2000

(51) Int. Cl.[7] ................................................. G06K 9/00
(52) U.S. Cl. ..................... 382/141; 382/100; 382/218
(58) Field of Search ............................... 382/100, 141, 382/203, 218; 348/340, 342, 335, 360; 356/124, 394, 239.1, 239.2; 430/30

(56) References Cited

U.S. PATENT DOCUMENTS

| | | | |
|---|---|---|---|
| 5,300,786 A | 4/1994 | Brunner et al. ............. 250/548 |
| 5,310,624 A | 5/1994 | Ehrlich ........................ 430/322 |
| 5,674,650 A | * 10/1997 | Dirksen et al. ................ 430/22 |
| 5,821,131 A | 10/1998 | Bae .............................. 438/16 |
| 5,902,703 A | 5/1999 | Leroux et al. .................. 430/5 |
| 5,969,807 A | * 10/1999 | Levinson et al. ............ 356/124 |
| 5,998,071 A | 12/1999 | King et al. .................... 430/30 |

* cited by examiner

Primary Examiner—Phuoc Tran
(74) Attorney, Agent, or Firm—George O. Saile; Stephen B. Ackerman

(57) ABSTRACT

Pigment-based resists tend to give off a certain amount of organic vapor during exposure. This brings about contamination of the projection lens surface as well as other parts of the system. A method to monitor this accumulation of solvent vapor on the lens surface is disclosed, based on a test matrix (in which exposure time and focal distance are systematically varied) through which a series of images are formed in the resist and then evaluated for quality. A key feature is the test patterns that are used for forming the images. Said patterns are designed so as to maximize the total amount of diffraction that occurs during image formation, thereby maximizing sensitivity to changes in lens quality. Several examples of the test patterns are provided.

20 Claims, 4 Drawing Sheets

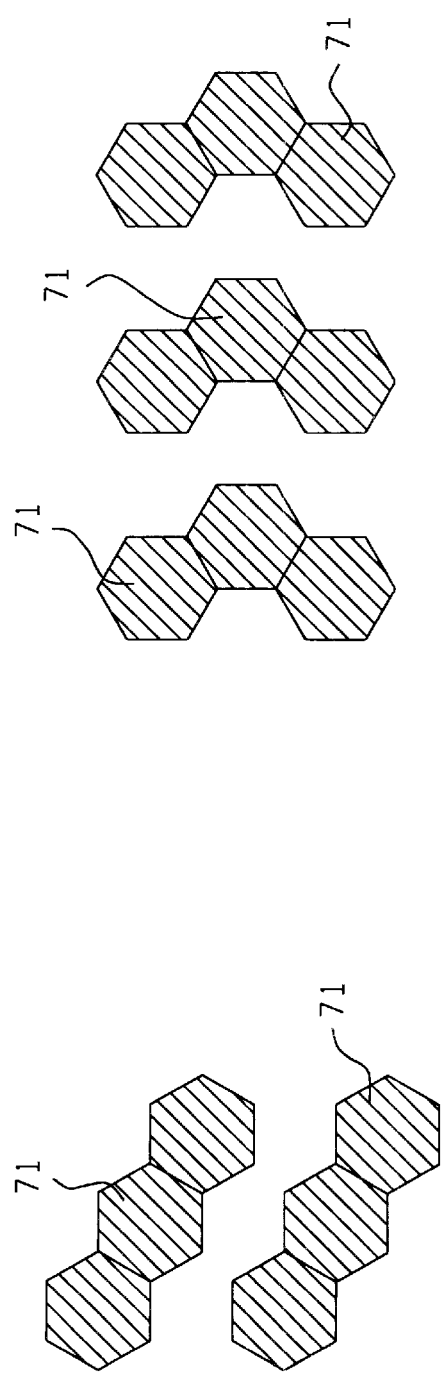
FIG. 7b
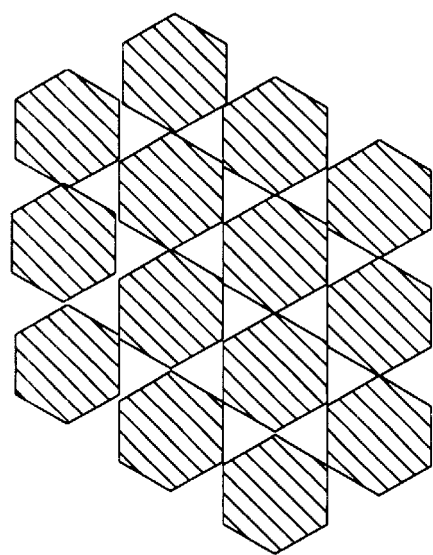
FIG. 8
FIG. 7a

METHOD TO MONITOR STEPPER LENS QUALITY IN COLOR FILTER PROCESS

FIELD OF THE INVENTION

The invention relates to the general field of integrated circuits with particular reference to light patternable dyes and maintenance of the associated stepper system.

BACKGROUND OF THE INVENTION

There are two principal types of color resist—dye-based and pigment-based, these pigments being usually red, blue, or green. Most of the pigment types give negative images (when used in photolithography), making them popular for commercial production. In a pigment-based resist, the pigment is about 25% of the total material, the rest being the polymer substrate, various additives and solvent. In practice, it is difficult to dissolve the pigment in the presence of the additives needed to bring about light sensitivity so a substantial amount of solvent is necessary to ensure full dissolution of the pigment.

As a consequence of this, the viscosity of pigment-based resists tends to be low and, furthermore, a certain amount of organic vapor from the solvent gets released during exposure. This brings about contamination of the projection lens surface as well as other parts of the system, which leads to abnormal (i.e. distorted) printed patterns, scum formation, and residues on bond pads. This accumulation of solvent vapor on the lens surface gets worse with time.

It is very important to detect this abnormal situation in time to be able to take corrective action, such as cleaning the lens or replacing contaminated parts. Otherwise, this negative effect seriously impacts the product quality of the color filter and increases production cost due to the rework actions that must be implemented. In Japan, some fabs use an extra projection lens of quartz material to catch the contamination, but this is still not enough for optimum production line operation. If a suitable monitor were available, the production line could become even more economical and competitive.

A routine search of the prior art was performed but no references that teach the exact processes and structures of the present invention were discovered. Several references of interest were, however, encountered along the way. For example, in U.S. Pat. No. 5,998,071, King et al. show a monitor that uses critical dimension bars to detect lens heating effects. In U.S. Pat. No. 5,300,786, Brunner et al. show a PSM test and monitor system while in U.S. Pat. No. 5,902,703, Leroux et al. show a modified box in box overlay monitor for detecting and measuring dimensional anomalies in photolithographic images formed with a stepper lens.

Bae (U.S. Pat. No. 5,821,131) shows a process of measuring the characteristics for the stepper lens while Ehrlich (U.S. Pat. No. 5,310,624) shows a dry photo process to avoid vapors from photoresist.

SUMMARY OF THE INVENTION

It has been an object of the present invention to provide a method for monitoring the lens in a stepper system that is exposed to organic vapors in order to detect changes in optical quality of the system.

Another object of the invention has been to provide a test pattern to be used in conjunction with said monitoring method.

A further object has been to detect these quality changes before product made using the lens is lost.

These objects have been achieved by means of a test matrix (in which exposure time and focal distance are systematically varied) through which a series of images are formed in a pigment-based resist and then evaluated for quality. A key feature is the test patterns that are used for forming the images. Said patterns are designed so as to maximize the total amount of diffraction that occurs during image formation, thereby maximizing sensitivity to changes in lens quality. Several examples of said test patterns are provided.

BRIEF DESCRIPTION OF THE DRAWINGS

FIGS. 7a and 7b show examples of non-ideal test patterns in which the opaque elements are hexagons.

FIG. 8 shows an ideal test pattern in which the opaque elements are hexagons.

DESCRIPTION OF THE PREFERRED EMBODIMENTS

As was discussed in the background section, it is important to be able to detect changes in lens quality that arise from contamination by organic vapors that come off certain resists. Furthermore, changes of this type need to be detected even before they manifest themselves in actual product. To this end, any test pattern that is to be used for this purpose needs to be more sensitive to slight changes in lens quality than the patterns customarily used for manufacturing integrated circuits.

Since all optical images are the result of interference between diffraction patterns that originate at the dark/light boundaries of the pattern being imaged, it follows that patterns having more such boundaries will be more sensitive to changes in lens quality than patterns that have fewer boundaries. A key feature of the present invention has therefore been to provide suitable patterns based on this premise. We have limited these patterns to straight line geometrical figures such as triangles, tetragons, pentagons, and hexagons since patterns for integrated circuits are themselves made up of straight lines, but it will be understood that the invention is not limited to straight lines.

We note here that, if the number of dark/light boundaries is to be maximized, edges of the geometrical figures we employ must not be canceled by being in contact with a neighboring figure. On the other hand, we want to crowd into the pattern as many of the figures as possible so they will need to occupy at least 50% of the total area.

Figure 1:
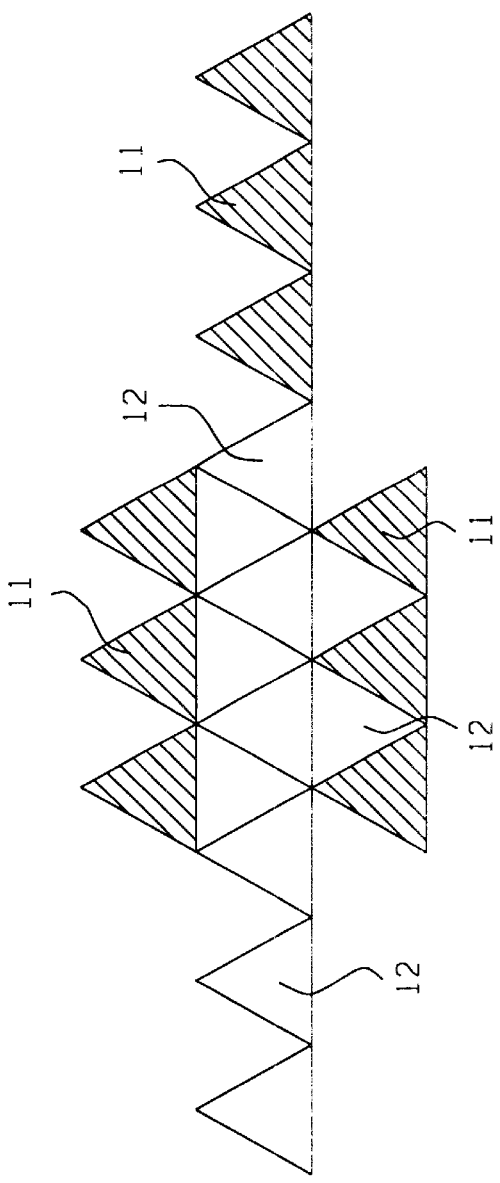
FIG. 1 shows a non-ideal test pattern in which the opaque elements are triangles.
Figure 2B:
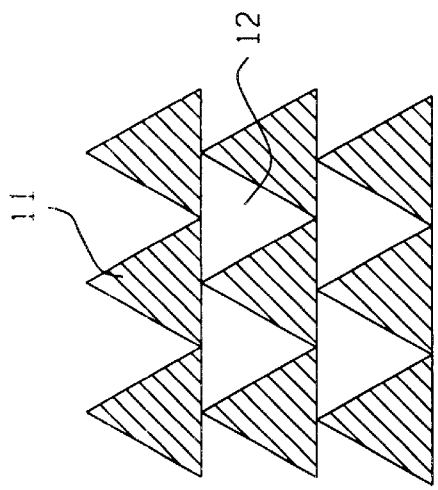
FIGS. 2a and 2b show examples of ideal test patterns in which the opaque elements are triangles.
Figure 2A:
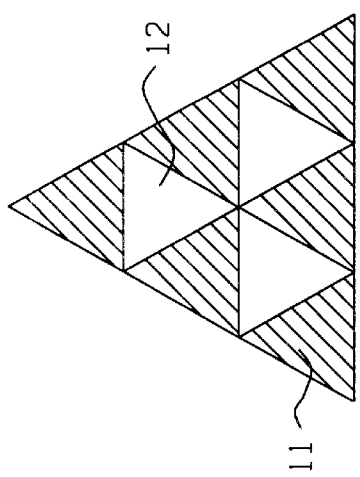

We begin our discussion of some examples of suitable (and unsuitable) patterns with the case of triangles by referring to FIG. 1 which is an example of a non-ideal pattern. Thus, although the opaque triangles, such as 11, never touch one another edge to edge, with contact being limited to vertex to vertex, they are outnumbered by the clear triangles, such as 12. Examples of ideal patterns for triangles are shown in FIGS. 2a and 2b. In the former case all contact is limited to vertex to vertex while in the latter it is vertex to edge, but in both cases the total area of opaque triangles just equals the total clear area.

Note that although the triangles in FIGS. 2a and 2b are shown as being all the same size (typically between about 2 and 14 microns on a side), it is also possible to provide a pattern in which the triangles vary in size over a range of between about 2 and 14 microns on a side. A pattern of the latter type is more expensive to produce but would be useful for use in conjunction with a wider selection of integrated circuit patterns.

Figure 3:
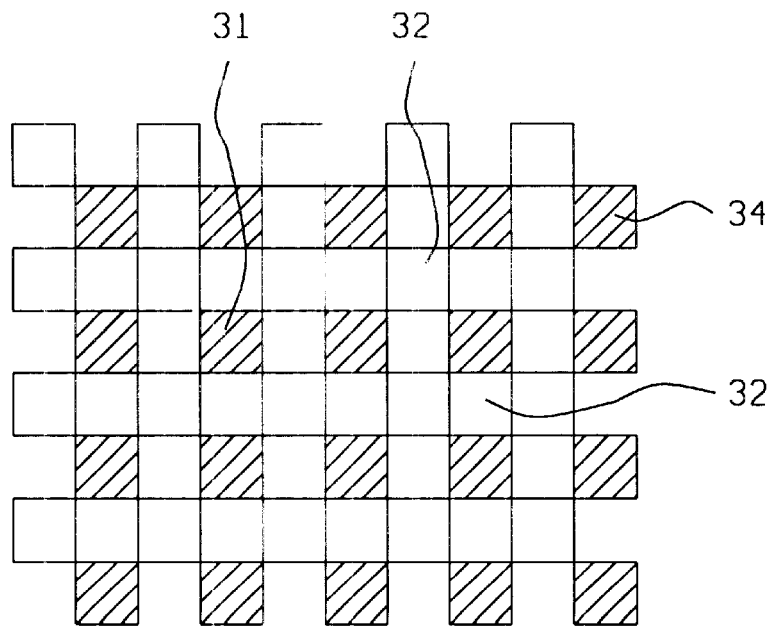
FIG. 3 shows a non-ideal test pattern in which the opaque elements are tetragons.

Referring now to FIG. 3 we show there an example of a non-ideal pattern made up of tetragons. Thus, although the opaque tetragons, such as 31, never touch one another edge to edge, they are outnumbered by the clear tetragons, such as 32. An example of an ideal pattern for tetragons is shown in FIG. 4 where, it can be seen, all contact is limited to vertex to vertex, but the total area of opaque tetragons just equals the total clear area.

Figure 4:
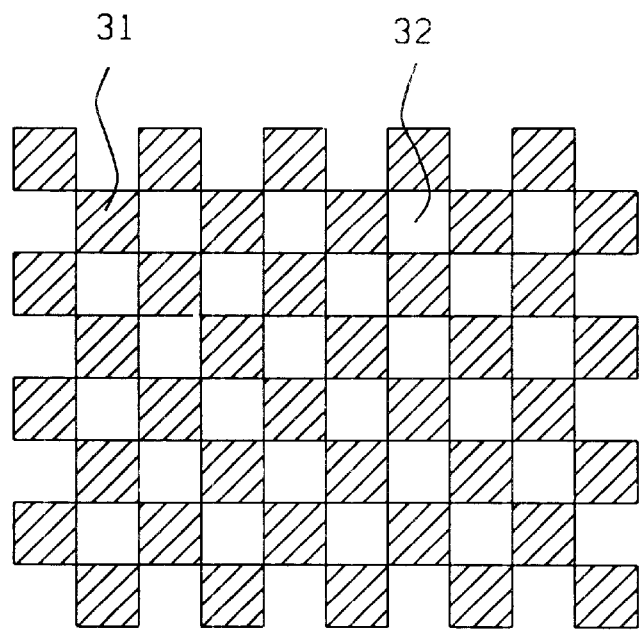
FIG. 4 shows an ideal test pattern in which the opaque elements are tetragons.

As we noted for the case of triangles, the tetragons in FIG. 4 may be all the same size (typically between about 2 and 14 microns on a side), or they may be incorporated in a pattern in which they vary in size over a range of between about 2 and 14 microns on a side. A pattern of the latter type is more expensive to produce but could be used with a wider selection of integrated circuit patterns.

A particular aspect of a test pattern such as the one shown in FIG. 4 is that tetragons are of the same general shape and disposition as the pixels that would be used to form images in the pigment-based resist. So, it is often advantageous to use, in these test patterns, tetragons that are of a size comparable to said pixels.

Figure 5:
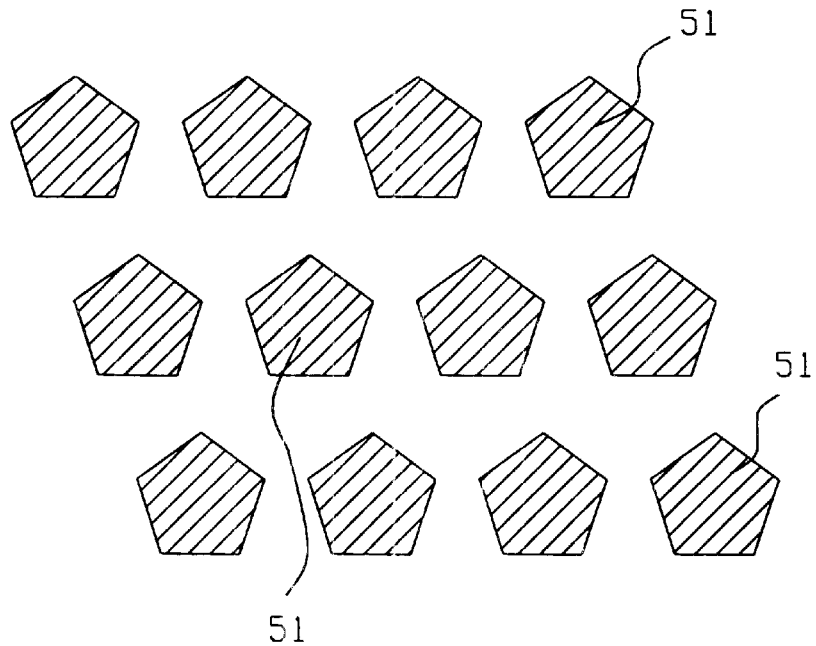
FIG. 5 shows a non-ideal test pattern in which the opaque elements are pentagons.

Moving on to FIG. 5 we show there an example of a non-ideal pattern made up of pentagons. Although the opaque pentagons, such as 51, never touch one another, their total area is less than that of the dear areas between them. An example of an ideal pattern for pentagons is shown in FIG. 6 where, it can be seen, all contact is limited to vertex to vertex, but the total area of opaque pentagons exceeds the total clear area.

Figure 6:
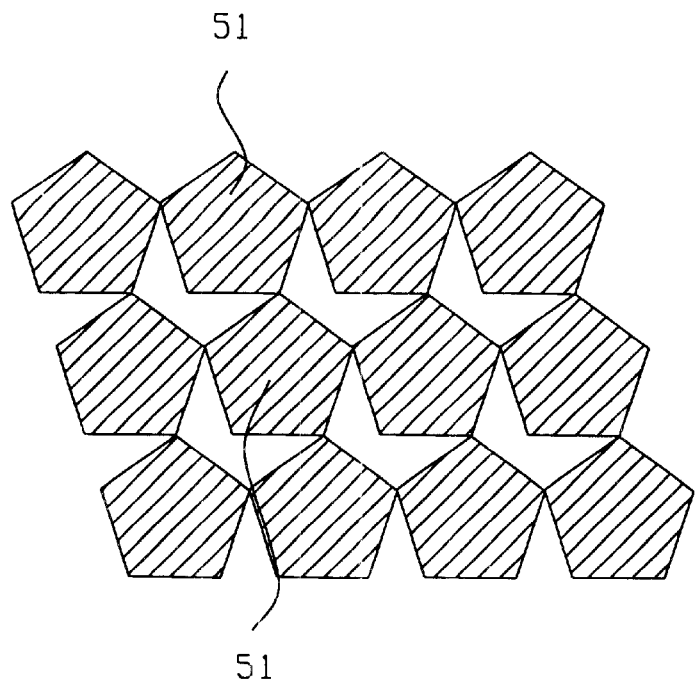
FIG. 6 shows an ideal test pattern in which the opaque elements are pentagons.

As we noted for the earlier cases, the pentagons in FIG. 6 may be all the same size (typically between about 2 and 14 microns on a side), or they may be incorporated in a pattern in which they vary in size over a range of between about 2 and 14 microns on a side. A pattern of the latter type is more expensive to produce but could be used with a wider selection of integrated circuit patterns.

In FIGS. 7a and 7b, we show examples of non-ideal patterns made up of hexagons. Although the opaque hexagons, such as 71, have limited contact with one another, their total area is less than that of the clear areas between them. An example of an ideal pattern for hexagons is shown in FIG. 8 where it can be seen that the total area of opaque hexagons exceeds the total clear area.

As we noted for the earlier cases, the hexagons in FIG. 8 may be all the same size (typically between about 2 and 14 microns on a side), or they may be incorporated in a pattern in which they vary in size over a range of between about 2 and 14 microns on a side. A pattern of the latter type is more expensive to produce but could be used with a wider selection of integrated circuit patterns.

Note that the light shielding pattern tends to make the contamination phenomenon more serious. The light shielding pattern size is usually much larger, generally 100 to 1,000 microns. Such large clear patterns add a great deal to the exposure of the photoresist. So, should the lens get contaminated, diffraction effects would be worse than without shielding patterns.

We now disclose a method for monitoring lens quality which uses the above described test patterns. We note first that when a lens receives a coating of organic material as a result of being exposed to its vapors, several effects can be expected. The coating may absorb some of the radiation used for imaging and turn it into heat. This will then exacerbate any lens heating effects that occur even in the absence of organic contamination. The organic layer may distort the shape of the lens and thereby introduce lens aberrations previously corrected for, such as curvature of field, or the organic layer may simply thicken the lens, thereby moving the focal plane forward.

The method begins with the provision of a reference pattern, this being a developed image of the test pattern of choice that was formed, under optimum conditions of exposure and focus (green pigment, zero distance from the focal plane, and about 800 mj. of radiant energy), at a time when the lens was known to be free of contamination. Then, different areas of an unexposed layer of the pigment-based resist are successively exposed to an image of the test pattern of choice. Each such exposure is done under different conditions, both the exposure energy and the location of the layer relative to the lens (the exposure plane) being systematically varied according to a pre-planned test matrix. For this test matrix the amount of radiant energy received during exposure is varied over a range between about 200 and 1,300 mj per column, while the distance from the focal plane (of the exposure plane) is varied over a range between about −2.0 and +2.0 $\mu$m.

A quick evaluation of the lens quality can also be made by bypassing the full test matrix and limiting exposure through the contaminated lens to the optimum conditions mentioned above.

After the resist layer has been exposed and developed it is compared with the reference pattern to determine to what extent, if any, the lens has been contaminated by the organic vapors.

While the invention has been particularly shown and described with reference to the preferred embodiments thereof, it will be understood by those skilled in the art that various changes in form and details may be made without departing from the spirit and scope of the invention.

What is claimed is:

1. A method for monitoring quality of a lens, having a focal plane, in a stepper system that has been exposed to organic vapors emitted from a pigment-based resist, comprising:

on a reticle, providing a test pattern;

providing a reference pattern consisting of a developed image of said test pattern that was formed when the lens was known to be free of contamination;

providing a layer of unexposed pigment-based resist;

through said reticle and lens, exposing different areas of the layer to an image of the test pattern whereby each such area receives an amount of radiant energy and is located in an exposure plane that is a distance from the focal plane;

developing the exposed areas; and then, by comparing said areas to the reference pattern, determining to what extent the lens has been contaminated by said organic vapors.

2. The method recited in claim 1 wherein said amount of radiant energy received during exposure is between about 200 and 1,300 mj per column.

3. The method recited in claim 1 wherein said distance from the focal plane is between about −2.0 and +2.0 μm.

4. The method recited in claim 1 wherein said test pattern maximizes diffraction effects associated with image formation therefrom.

5. The method recited in claim 1 wherein the pigment is of a color selected from the group consisting of red, green, and blue.

6. The method recited in claim 1 wherein the pigment is green, the distance from the focal plane is zero, and the amount of radiant energy received during exposure is about 800 mj per column.

7. The method recited in claim 1 wherein said test pattern further comprises an array of tetragons of a size comparable to pixels in an image formed in said pigment-based layer of resist.

8. A test pattern for monitoring quality of a lens in a stepper system that has been exposed to organic vapors emitted from a pigment-based resist, comprising:

a plurality of opaque triangles having a total area;

between the triangles, clear areas having a total area;

the total area of the triangles being greater than or equal to the total area of the clear areas;

each triangle touching at least four other triangles;

some triangles touching vertex to vertex;

some triangle touching vertex to edge; and no triangles touching edge to edge, thereby maximizing diffraction effects associated with image formation from said pattern.

9. The test pattern described in claim 8 wherein the triangles are all the same size, measuring between about 2 and 14 microns on a side.

10. The test pattern described in claim 8 wherein the triangles vary in size over a range of between about 2 and 14 microns on a side.

11. A test pattern for monitoring quality of a lens in a stepper system that has been exposed to organic vapors emitted from a pigment-based resist, comprising:

a plurality of opaque tetragons having a total area;

between the tetragons, clear areas having a total area;

the total area of the tetragons being greater than or equal to the total area of the clear areas; and each tetragon touching at least four other tetragons, such contact being limited to vertex to vertex, thereby maximizing diffraction effects associated with image formation from said pattern.

12. The test pattern described in claim 11 wherein the tetragons are all the same size, measuring between about 2 and 14 microns on a side.

13. The test pattern described in claim 11 wherein the tetragons vary in size over a range of between about 2 and 14 microns on a side.

14. The test pattern described in claim 11 wherein the tetragons are of a size comparable to pixels in an image formed in said pigment-based layer of resist.

15. A test pattern for monitoring quality of a lens in a stepper system that has been exposed to organic vapors emitted from a pigment-based resist, comprising:

a plurality of opaque pentagons having a total area;

between the pentagons, clear areas having a total area;

the total area of the pentagons being greater than or equal to the total area of the clear areas; and each pentagon touching at least four other pentagons, such contact being limited to vertex to vertex, thereby maximizing diffraction effects associated with image formation from said pattern.

16. The test pattern described in claim 15 wherein the pentagons are all the same size, measuring between about 2 and 14 microns on a side.

17. The test pattern described in claim 15 wherein the pentagons vary in size over a range of between about 2 and 14 microns on a side.

18. A test pattern for monitoring quality of a lens in a stepper system that has been exposed to organic vapors emitted from a pigment-based resist, comprising:

a plurality of opaque hexagons having a total area;

between the hexagons, clear areas having a total area;

the total area of the hexagons being greater than or equal to the total area of the clear areas; and each hexagon touching six other hexagons, such contact being limited to vertex to vertex, thereby maximizing diffraction effects associated with image formation from said pattern.

19. The test pattern described in claim 18 wherein the hexagons are all the same size, measuring between about 2 and 14 microns on a side.

20. The test pattern described in claim 18 wherein the hexagons vary in size over a range of between about 2 and 14 microns on a side.

* * * * *